United States Patent
Hsu et al.

(10) Patent No.: US 9,622,385 B2
(45) Date of Patent: Apr. 11, 2017

(54) METHOD OF ASSEMBLING A HEAT DISSIPATING MODULE OF AN ELECTRONIC DEVICE

(71) Applicant: DELTA ELECTRONICS, INC., Taoyuan Hsien (TW)

(72) Inventors: Cheng-Wei Hsu, Taoyuan Hsien (TW); Hung-Chuan Chen, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 127 days.

(21) Appl. No.: 14/276,805

(22) Filed: May 13, 2014

(65) Prior Publication Data
US 2015/0181765 A1    Jun. 25, 2015

(30) Foreign Application Priority Data
Dec. 19, 2013    (TW) ............... 102147144 A (51) Int. Cl.
| | | |
|---|---|---|
| *B23P 19/00* | (2006.01) | |
| *H05K 7/20* | (2006.01) | |
| *H05K 1/02* | (2006.01) | |
| *H05K 3/34* | (2006.01) | |

(52) U.S. Cl.
CPC ....... *H05K 7/20509* (2013.01); *H05K 7/2049* (2013.01); *H05K 1/0203* (2013.01); *H05K 3/3447* (2013.01); *H05K 2201/066* (2013.01); *H05K 2201/105* (2013.01); *H05K 2201/10409* (2013.01); *Y10T 29/49142* (2015.01)

(58) Field of Classification Search
CPC .... H05K 1/0203; H05K 3/328; H05K 3/3447; H05K 7/02; H05K 7/2049; H05K 7/20436; H05K 7/20509; H05K 2201/105; H05K 2201/066; H05K 2201/10409
USPC ...... 29/592.1, 829, 830–832, 841, 846, 851, 29/854; 361/704, 705, 717, 719, 720, 361/739
See application file for complete search history.

(56) References Cited

U.S. PATENT DOCUMENTS

2010/0128443 A1    5/2010    Chen
2010/0271785 A1*  10/2010    Hsieh ................. H01L 23/36
                                                    361/717

FOREIGN PATENT DOCUMENTS

| CN | 101754639 A | 6/2010 |
|---|---|---|
| TW | 200814910 | 3/2008 |
| TW | M370289 | 12/2009 |
| TW | 201039412 | 11/2010 |

(Continued)

*Primary Examiner* — Paul D Kim
(74) *Attorney, Agent, or Firm* — Kirton McConkie; Evan R. Witt (57) ABSTRACT

A heat dissipating module of an electronic device includes a casing, a circuit board, at least one heat generation element, and a fastening assembly. The casing includes at least one lateral plate. The at least one heat generation element is firmly fixed on the at least one lateral plate through a fixing element. After the at least one lateral plate and the circuit board are combined together through the fastening assembly, the at least one lateral plate and the circuit board pass through a reflow furnace, so that the at least one heat generation element is welded on the circuit board. The heat generated by the at least one heat generation element is transferred to the at least one lateral plate of the casing so as to be dissipated away.

4 Claims, 9 Drawing Sheets

(56) References Cited

FOREIGN PATENT DOCUMENTS

TW 201328513 7/2013

\* cited by examiner

METHOD OF ASSEMBLING A HEAT DISSIPATING MODULE OF AN ELECTRONIC DEVICE

FIELD OF THE INVENTION

The present invention relates to a heat dissipating module of an electronic device, and more particularly to a heat dissipating module of an electronic device for dissipating heat through a casing of the electronic device. The present invention also relates to a method of assembling the heat dissipating module.

BACKGROUND OF THE INVENTION

With increasing integration of integrated circuits, electronic devices such as power supply apparatuses are developed toward minimization. As the volume of the electronic device is gradually decreased, the problem associated with heat dissipation becomes more serious. When the power supply apparatus is operated, the electronic components on a printed circuit board may generate energy in the form of heat. If no proper heat-dissipating mechanism is provided to transfer enough heat to the ambient air, the elevated operating temperature may result in damage of the electronic components or reduced operation efficiency. Conventionally, an active heat-dissipation mechanism (e.g. a fan) is used to inhale the external cooling air to cool the electronic components or exhaust the hot air to the ambient air. Alternatively, a large-area heat sink is used to transfer the heat to the surroundings. For example, a metal casing of the electronic device is used as a part of a heat transfer path. The heat generation element is usually fixed on the casing of the electronic device. Since the heat transfer path is the shortest, the heat dissipating efficacy is enhanced.

Figure 1A:
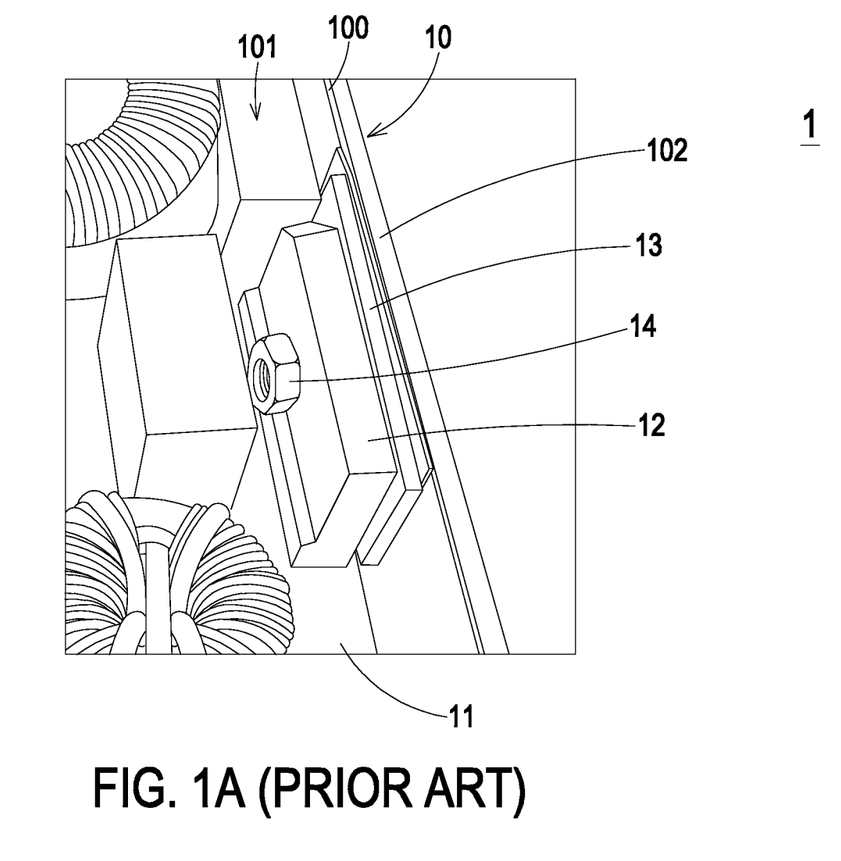
FIG. 1A schematically illustrates the inner structure of a conventional electronic device.

FIG. 1A schematically illustrates the inner structure of a conventional electronic device. As shown in FIG. 1A, the electronic device 1 includes a metal casing 10, a circuit board 11, at least one heat generation element 12, and a heat dissipating element 13. The metal casing 10 is a box-type casing with an entrance 100, a receiving space 101, and at least one lateral wall 102. For clarification and brevity, only one lateral wall 102 are shown in the drawing. The entrance 100 is in communication with the receiving space 101. The heat generation element 12 is a transistor or any other electronic component that generates heat. Firstly, the heat generation element 12 is mounted on the circuit board 11. That is, the pins (not shown) of the at least one heat generation element 12 are inserted into corresponding conductive holes (not shown) of the circuit board 11. After the circuit board 11 and the heat generation element 12 pass through a reflow furnace (not shown), the heat generation element 12 is securely fixed on the circuit board 11. Then, the circuit board 11 is placed in the receiving space 101 of the metal casing 10 through the entrance 100. In addition, the heat generation element 12 is arranged beside the lateral wall 102. Since there is a gap between the at least one heat generation element 12 and the lateral wall 102, the heat generation element 12 fails to be securely attached on the lateral wall 102. For solving this drawback, a heat dissipating element 13 (e.g. a heat sink or a thermal pad) is interposed between the heat generation element 12 and the lateral wall 102. Afterwards, the heat generation element 12, the heat dissipating element 13 and the lateral wall 102 are combined together through a fixing element 14. For example, the fixing element 14 is a screw. Consequently, the heat generation element 12 can be securely attached on the heat dissipating element 13. Under this circumstance, the heat of the heat generation element 12 is transferred to the heat dissipating element 13 by thermal conduction and then transferred to the large-area lateral wall 102 to be dissipated away.

However, the conventional assembling method still has some drawbacks. For example, while the fixing element 14 is penetrated through the heat generation element 12 and the heat dissipating element 13 and tightened into and the lateral wall 102, a stress may be generated. Due to the stress, the solder paste for welding the pins of the heat generation element 12 is possibly cracked or the pins of heat generation element 12 are possibly damaged. For facilitating tightening the heat generation element 12 into the lateral wall 102 of the metal casing 10, before the circuit board 11 and the heat generation element 12 pass through the reflow furnace, the heat generation element 12 should be fixed by an additional jig (not shown). Consequently, after the circuit board 11 and the heat generation element 12 pass through the reflow furnace, the heat generation element 12 is not shifted. Under this circumstance, the heat generation element 12 can be securely tightened into the lateral wall 102 of the metal casing 10. In other words, the conventional assembling method is more complicated. However, it is found that the position of the heat generation element 12 may still be shifted. Moreover, since the heat generation element 12 has been fixed on the circuit board 11, it is difficult and time-consuming to align the installation positions of the heat generation element 12, the heat dissipating element 13 and the lateral wall 102 with each other. In other words, the conventional assembling method is both complicated and time-consuming.

Figure 1B:
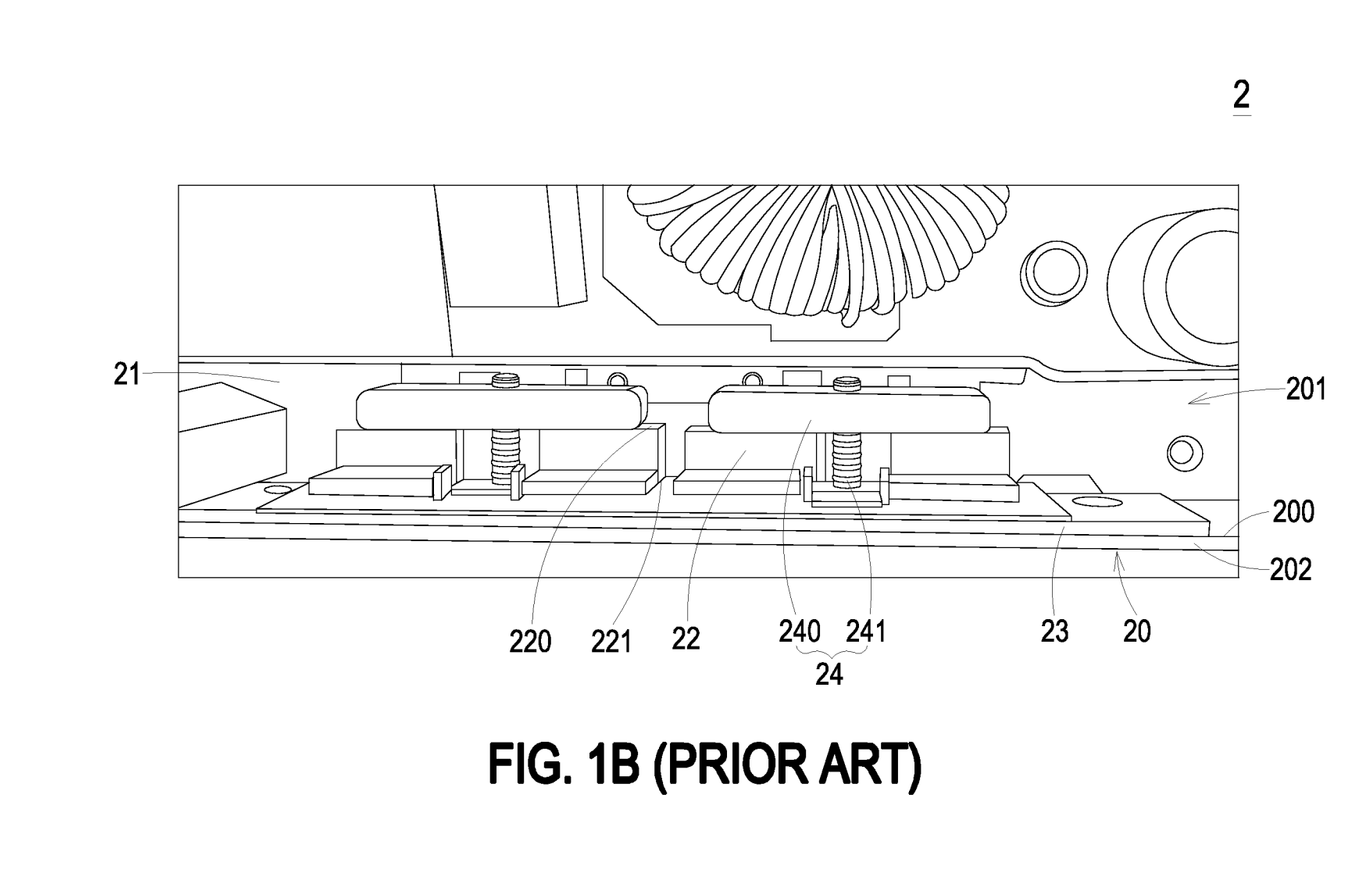
FIG. 1B schematically illustrates the inner structure of another conventional electronic device.

FIG. 1B schematically illustrates the inner structure of another conventional electronic device. As shown in FIG. 1B, the electronic device 2 includes a metal casing 20, a circuit board 21, at least one heat generation element 22, and a heat dissipating element 23. The metal casing 20 includes an entrance 200, a receiving space 201, and a lateral wall 202. Firstly, the heat generation element 22 is mounted on the circuit board 21. After the circuit board 21 and the heat generation element 22 pass through a reflow furnace (not shown), the heat generation element 22 is securely fixed on the circuit board 21. Then, the circuit board 21 is placed in the receiving space 201 of the metal casing 20. In addition, the heat generation element 22 is arranged beside the lateral wall 202. Then, the heat dissipating element 23 is interposed between the heat generation element 22 and the lateral wall 202. Afterwards, the heat generation element 22, the heat dissipating element 23 and the lateral wall 202 are combined together through a fixing assembly 24.

Please refer to FIG. 1B again. The fixing assembly 24 includes a resilience sheet 240 and a screw 241. The resilience sheet 240 is contacted with a first surface 220 of the heat generation element 22. A second surface 221 of the heat generation element 22 is contacted with the heat dissipating element 23. After the screw 241 is sequentially penetrated through the resilience sheet 240, the heat generation element 22 and the lateral wall 202, the heat generation element 22 is firmly attached on the heat dissipating element 23. Under this circumstance, the heat of the heat generation element 22 is transferred to the heat dissipating element 23 and then transferred to the large-area lateral wall 202 to be dissipated away. In other words, the heat generation element 22, the heat dissipating element 23 and the lateral wall 202 are combined together through the fixing assembly 24 after the circuit board 21 and the heat generation element 22 pass through the reflow furnace. Similarly, it is difficult to interpose the heat dissipating element 23 between the heat generation element 22 and the lateral plate 202. Moreover, the solder paste for welding the pins of the heat generation element 22 is possibly cracked or the pins of heat generation element 22 are possibly damaged.

Therefore, there is a need of providing a heat dissipating module of an electronic device and a method of assembling the heat dissipating module in order to eliminate the above drawbacks.

SUMMARY OF THE INVENTION

The present invention provides a heat dissipating module for directly attaching a heat generation element on a casing, so that there is no gap formed between the heat generation element and the casing and the possibility of cracking of the solder paste or damaging the pins of heat generation element will be minimized.

The present invention provides a method of assembling a heat dissipating module. After the heat generation element is fixed on the casing, the casing and a circuit board are combined together through a fastening assembly. Consequently, the heat dissipating efficacy is enhanced, the process of assembling the heat dissipating module is simplified, the fabricating cost is reduced, and the structural strength is increased.

In accordance with an aspect of the present invention, there is provided a heat dissipating module of an electronic device. The heat dissipating module includes a casing, a circuit board, at least one heat generation element, and a fastening assembly. The casing includes at least one lateral plate. The at least one heat generation element is firmly fixed on the at least one lateral plate through a fixing element. After the at least one lateral plate and the circuit board are combined together through the fastening assembly, the at least one lateral plate and the circuit board pass through a reflow furnace, so that the at least one heat generation element is welded on the circuit board. The heat generated by the at least one heat generation element is transferred to the at least one lateral plate of the casing so as to be dissipated away.

In accordance with another aspect of the present invention, there is provided a method of assembling a heat dissipating module of an electronic device. Firstly, at least one lateral plate of a casing, at least one heat generation element, a circuit board and a fastening assembly are provided. Then, the at least one heat generation element is firmly fixed on the at least one lateral plate through a fixing element. Then, the at least one lateral plate and the circuit board are combined together through the fastening assembly. Afterwards, the at least one lateral plate and the circuit board pass through a reflow furnace, so that the at least one heat generation element is welded on the circuit board.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
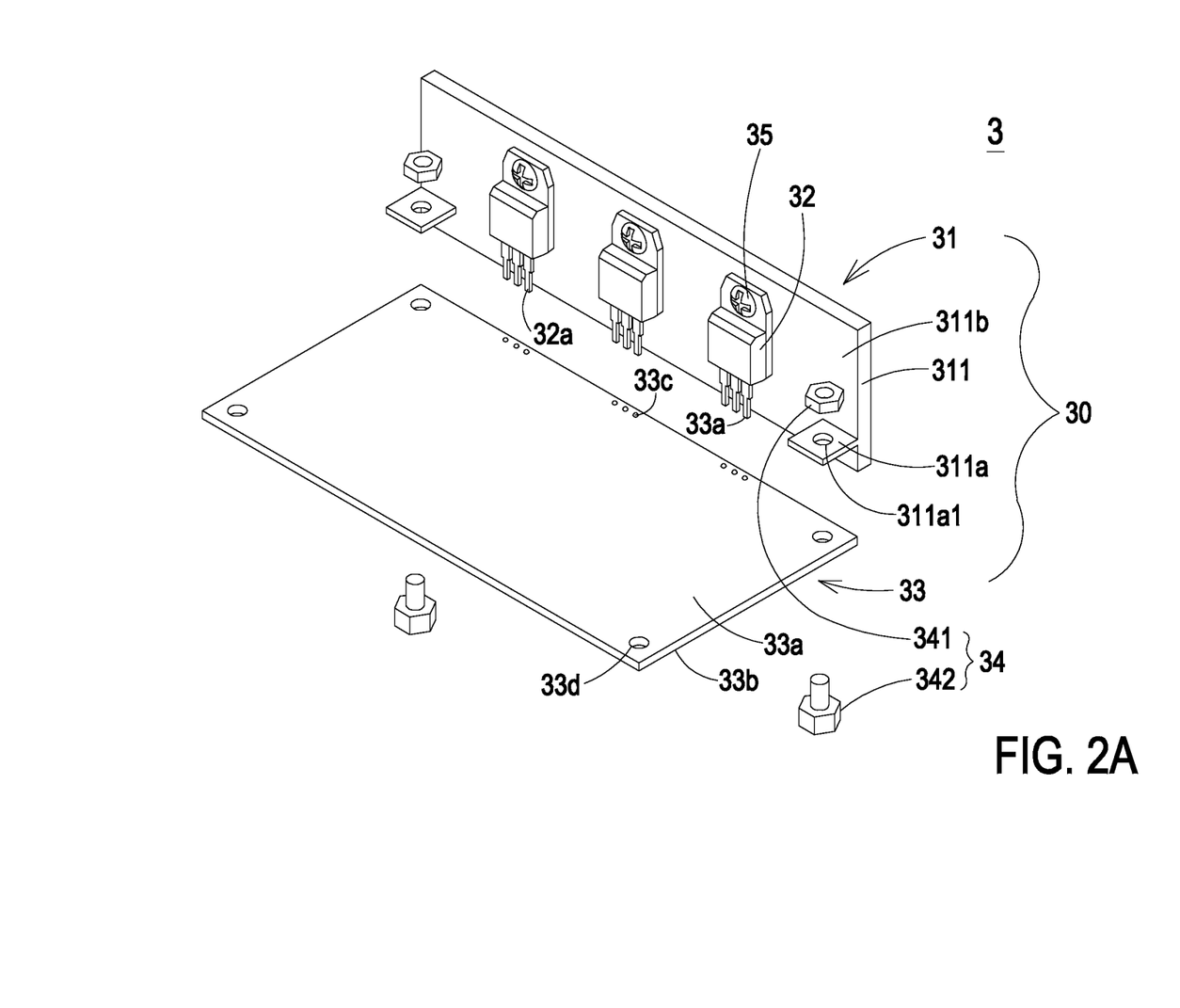
FIG. 2A is a schematic exploded view illustrating a heat dissipating module of an electronic device according to a first embodiment of the present invention.

FIG. 2A is a schematic exploded view illustrating a heat dissipating module of an electronic device according to a first embodiment of the present invention. An example of the electronic device 3 includes but is not limited to a power supply apparatus. As shown in FIG. 2A, the heat dissipating module 30 of the electronic device 3 includes a casing 31, at least one heat generation element 32, a circuit board 33, and a fastening assembly 34. The casing 31 comprises at least one lateral plate 311. The at least one heat generation element 32 is firmly fixed on the at least one lateral plate 311 through a fixing element 35. Then, the at least one lateral plate 311 and the circuit board 33 are combined together through the fastening assembly 34. Then, the at least one lateral plate 311 and the circuit board 33 pass through a reflow furnace (not shown), so that the at least one heat generation element 32 are welded on the circuit board 33. Under this circumstance, the at least one heat generation element 32 is assembled with the casing 31 and the circuit board 33 through the fastening assembly 34. In addition, the heat of the heat generation element 32 is transferred to the large-area lateral plate 311 of the casing 31 to be dissipated away.

Figure 2B:
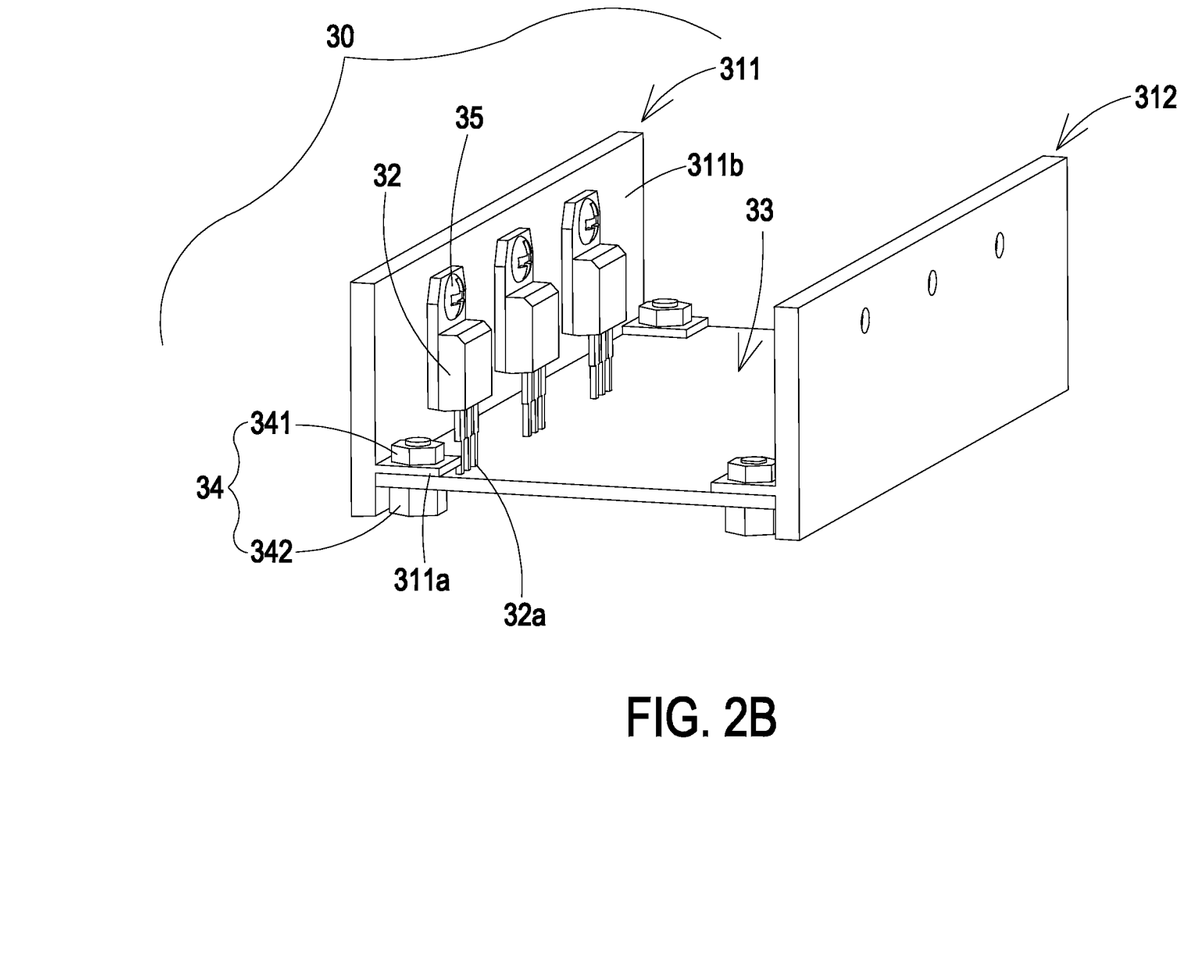
FIG. 2B is a schematic assembled view illustrating the heat dissipating module of FIG. 2A.
Figure 2C:
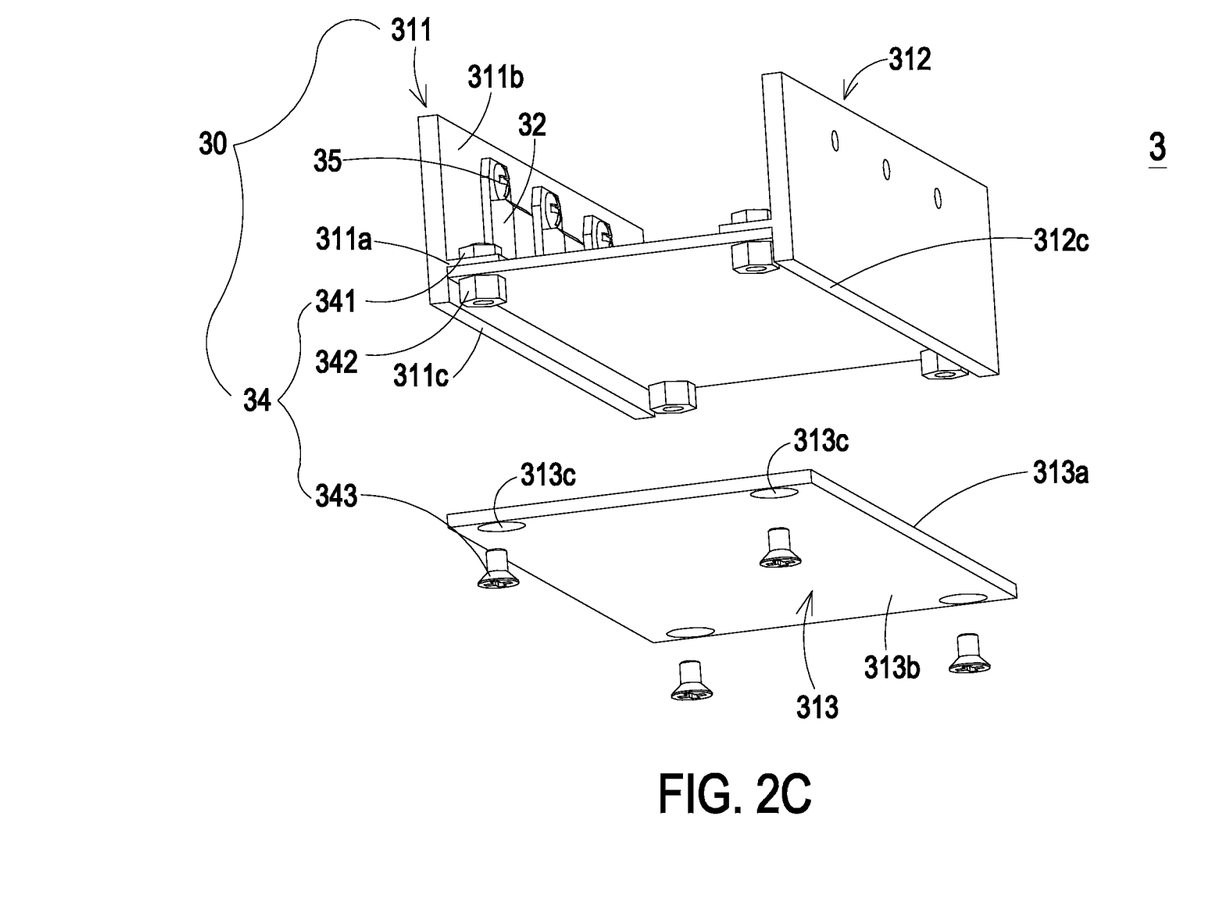
FIG. 2C is a schematic exploded view illustrating a heat dissipating module of an electronic device according to a second embodiment of the present invention.

In this embodiment as shown in FIG. 2B, the casing 31 comprises a first lateral plate 311 and a second lateral plate 312. The first lateral plate 311 and the second lateral plate 312 are opposed to each other. In another embodiment as shown in FIG. 2C, the casing 31 comprises the first lateral plate 311, the second lateral plate 312 and a lower plate 313, so that the casing 31 has a U-shaped box profile. It is noted that numerous modifications and alterations of the heat dissipating module may be made while retaining the teachings of the invention. For enhancing the heat dissipating efficacy, it is preferred that the casing 31 is made of a metallic material. An example of the heat generation element 32 includes but is not limited to a transistor or any other electronic component that generates heat. The heat generation element 32 comprises a plurality of pins 32a. The pins 32a are electrically connected with the circuit board 33. The circuit board 33 has a first top surface 33a and a first bottom surface 33b. The first top surface 33a and the first bottom surface 33b are opposed to each other. The circuit board 33 further comprises a plurality of holes 33c. The plural holes 33c run through the first top surface 33a and the first bottom surface 33b. The pins 32a of the heat generation element 32 are inserted into corresponding holes 33c.

Figure 5:
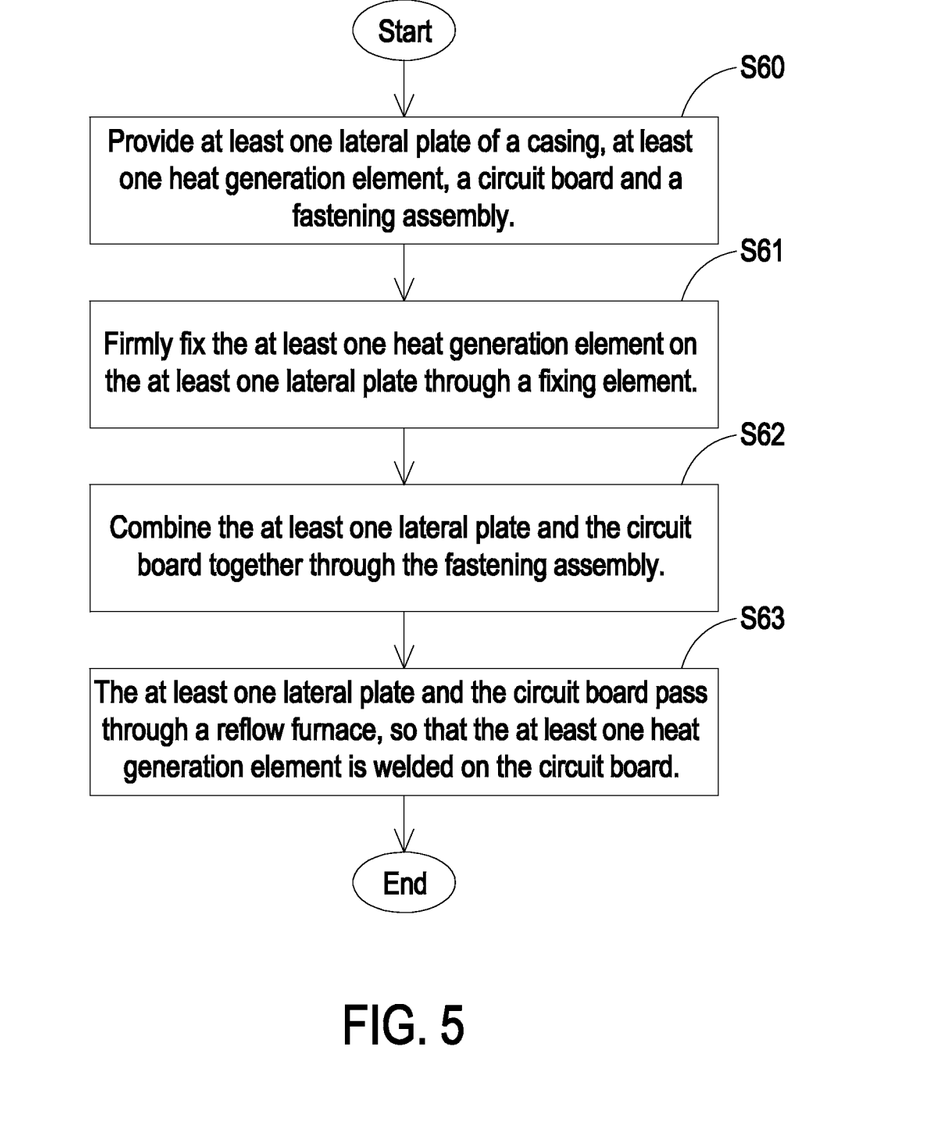
FIG. 5 is flowchart illustrating a method of assembling the heat dissipating module according to an embodiment of the present invention.

In this embodiment, the fastening assembly 34 at least comprises a first fastening part 341 and a second fastening part 342. By the fastening assembly 34, the lateral plate 311 and the circuit board 33 are combined together. FIG. 5 is flowchart illustrating a method of assembling the heat dissipating module according to an embodiment of the present invention. Please refer to FIG. 2A and FIG. 5. Firstly, in the step S60, at least one lateral plate 311 of a casing 31, at least one heat generation element 32, a circuit board 33 and a fastening assembly 34 are provided. Then, in the step S61, the at least one heat generation element 32 is firmly fixed on the at least one lateral plate 311 through a fixing element 35. An example of the fixing element 35 includes but is not limited to a screw, a clamp or a tenon. By means of the fixing element 35, there is no gap between the heat generation element 32 and the lateral plate 311. In other words, it is not necessary to interpose a heat dissipating element between the heat generation element 32 and the lateral plate 311. Consequently, the heat of the heat generation element 32 can be directly and quickly transferred to the large-area lateral plate 311 of the casing 31, and the cost of the heat dissipating element is saved.

Then, in the step S62, the at least one lateral plate 311 and the circuit board 33 are combined together through the fastening assembly 34. Since the at least one heat generation element 32 has been firmly fixed on the at least one lateral plate 311 through the fixing element 35, the plural pins 32a of the heat generation element 32 are also inserted into corresponding holes 33c of the circuit board 33. Consequently, the heat generation element 32 is electrically connected with a trace (not shown) of the circuit board 33. As mentioned above, the fastening assembly 34 at least comprises the first fastening part 341 and the second fastening part 342. Moreover, the lateral plate 311 further comprises a lock part 311a. In this embodiment, the first fastening part 341 is a nut, the second fastening part 342 is a screw, and the lock part 311a is a protruding structure with an opening 311a1. The second fastening part 342 of the fastening assembly 34 may be penetrated upwardly through the opening 311a1 of the lock part 311a. For combining the lateral plate 311 and the circuit board 33 together, the first fastening part 341 of the fastening assembly 34 is aligned with the lock part 311a of the lateral plate 311, then the second fastening part 342 of the fastening assembly 34 is sequentially penetrated through a perforation 33d of the circuit board 33 and the lock part 311a of the lateral plate 311, and finally the second fastening part 342 is combined with the first fastening part 341. Consequently, the lateral plate 311 and the circuit board 33 are combined together through the fastening assembly 34.

Alternatively, in another embodiment, the first fastening part 341 is a screw, and the second fastening part 342 is a nut. Under this circumstance, after the first fastening part 341 of the fastening assembly 34 is aligned with the lock part 311a of the lateral plate 311, the first fastening part 341 of the fastening assembly 34 is sequentially and downwardly penetrated through the lock part 311a of the lateral plate 311 and the perforation 33d of the circuit board 33, and then the first fastening part 341 is combined with the second fastening part 342. In other words, the structures of the first fastening part 341 and the second fastening part 342 and the way of combining the first fastening part 341 with the second fastening part 342 are not restricted.

Then, in the step S63, the at least one lateral plate 311 and the circuit board 33 pass through a reflow furnace (not shown), so that the at least one heat generation element 32 is welded on the circuit board 33. The assembling structure of the heat dissipating module is shown in FIG. 2B.

Figure 2D:
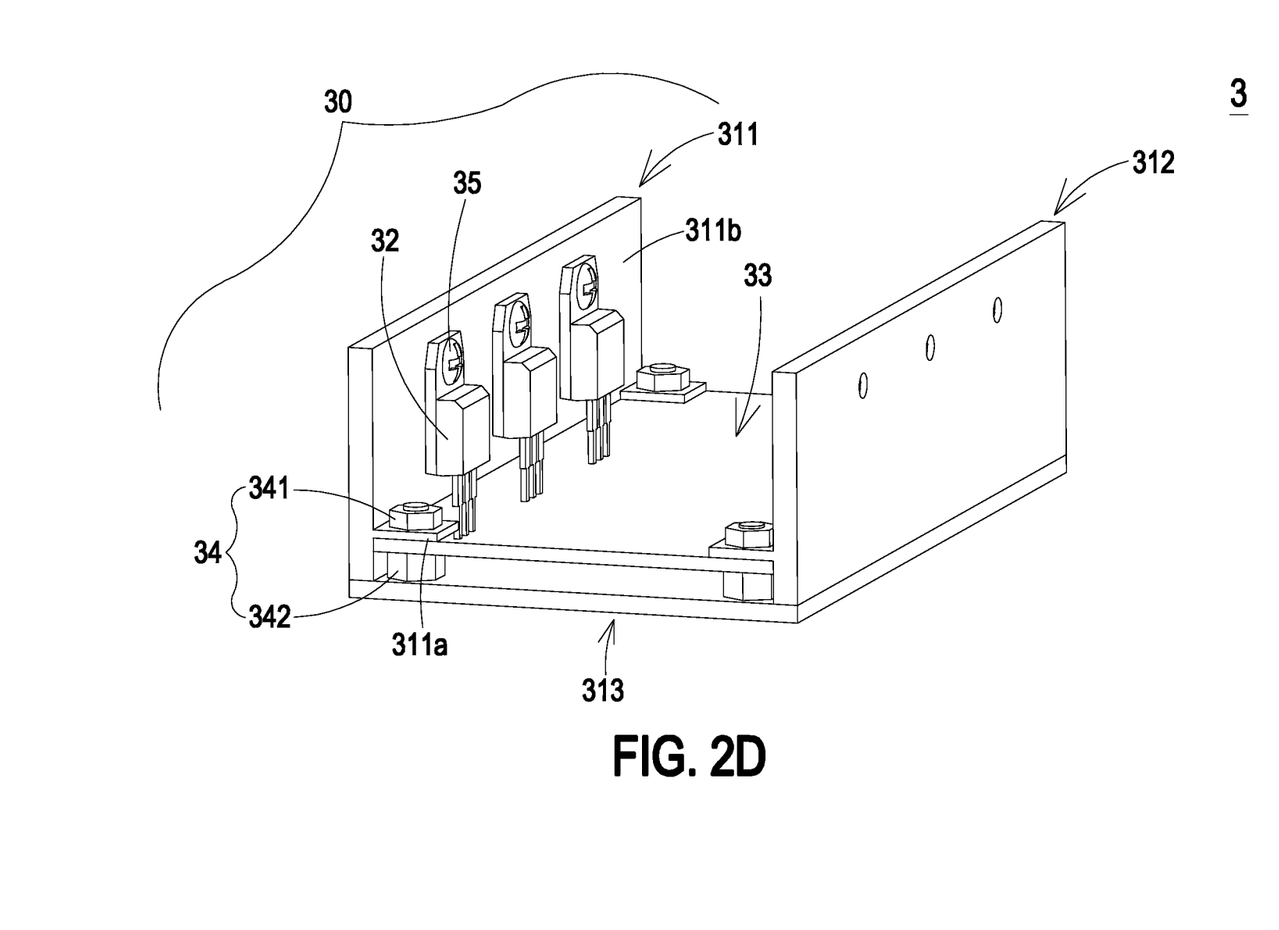
FIG. 2D is a schematic assembled view illustrating the heat dissipating module of FIG. 2C.

Please refer to FIG. 2C again. In this embodiment, the casing 31 comprises the first lateral plate 311, the second lateral plate 312, and the lower plate 313. The first lateral plate 311 and the second lateral plate 312 are opposed to each other. The lower plate 313 comprises a second top surface 313a and a second bottom surface 313b. The second top surface 313a and the second bottom surface 313b are opposed to each other. The lower plate 313 further comprises a plurality of perforations 313c. The plural perforations 313c run through the second top surface 313a and the second bottom surface 313b. The lower plate 313 is contacted with the bottom 311c of the first lateral plate 311 and the bottom 312c of the second lateral plate 312. Consequently, the heat dissipating module has a U-shaped box profile. In this embodiment, the fastening assembly 34 further comprises a third fastening part 343. In this embodiment, the third fastening part 343 is another screw. Preferably, the tip of the third fastening part 343 matches the notch of the head of the second fastening part 342. Consequently, the second fastening part 342 and the third fastening part 343 can be engaged with each other. After the third fastening part 343 of the fastening assembly 34 is sequentially penetrated through a corresponding hole 313c of the lower plate 313, the tip of the third fastening part 343 is engaged with the notch of the head of the second fastening part 342. By means of the first fastening part 341, the second fastening part 342 and the third fastening part 343 of the fastening assembly 34, the first lateral plate 311, the circuit board 33 and the lower plate 313 are combined together. The assembling structure of the heat dissipating module is shown in FIG. 2D.

Figure 3:
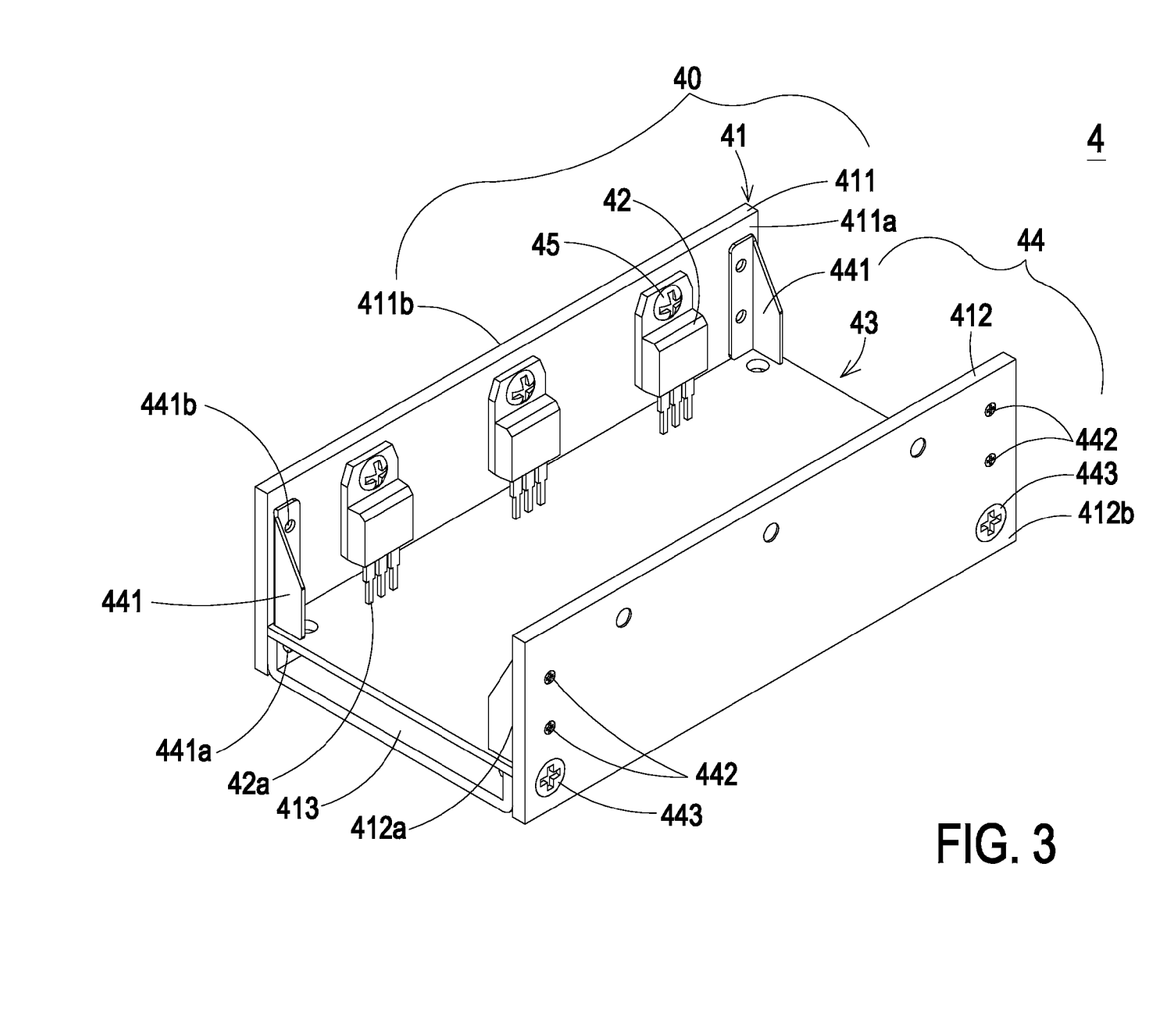
FIG. 3 is a schematic perspective view illustrating a heat dissipating module of an electronic device according to a third embodiment of the present invention.

FIG. 3 is a schematic perspective view illustrating a heat dissipating module of an electronic device according to a third embodiment of the present invention. As shown in FIG. 3, the heat dissipating module 40 of the electronic device 4 at least comprises a casing 41, a plurality of heat generation elements 42, a circuit board 43, and a plurality of fastening assemblies 44. The casing 41 comprises a first lateral plate 411, a second lateral plate 412, and a lower plate 413. Firstly, the heat generation elements 42 are firmly fixed on the first lateral plate 411, the second lateral plate 412 through corresponding fixing elements 45. Then, the pins 42a of the heat generation elements 42 are inserted into corresponding holes (not shown) of the circuit board 43, and the first lateral plate 411, the second lateral plate 412 and the circuit board 43 are combined together through the fastening assembly 44. Then, the first lateral plate 411, the second lateral plate 412 and the circuit board 43 pass through a reflow furnace (not shown), so that the heat generation elements 42 are welded on the circuit board 43. Under this circumstance, the heat generation elements 42 are assembled with the casing 41 and the circuit board 43 through the fastening assembly 44. In addition, the heat of the heat generation elements 42 is transferred to the large-area lateral plates 411 and 412 of the casing 41 to be dissipated away.

In comparison with the above embodiments, the structure of the fastening assembly 44 and the fastening way of the fastening assembly 44 of this embodiment are distinguished. As shown in FIG. 3, the fastening assembly 44 comprises a first fastening part 441, a second fastening part 442, and a third fastening part 443. The first fastening part 441 is an elongated lock plate. The second fastening part 442 and the third fastening part 443 are screws. The first fastening part 441 comprises a leg 441a and a plurality of openings 441b. After the heat generation elements 42 are fixed on the first lateral plate 411 and the second lateral plate 412, the process of assembling the first lateral plate 411, the second lateral plate 412 and the circuit board 43 through the fastening assemblies 44 will be illustrated as follows. Firstly, the first fastening part 441 of a first fastening assembly 44 is located at an inner side 411a of the first lateral plate 411, wherein the leg 441a of the first fastening part 441 is penetrated through a corresponding perforation (not shown) of the circuit board 43. Consequently, the fastening assembly 44 is initially fixed on the circuit board 43. Then, the second fastening part 442 is penetrated through the first lateral plate 411 from an outer side 411b to the inner side 411a and then tightened into the corresponding opening 441b of the first fastening part 441 of the first lateral plate 411. Similarly, the first fastening part 441 of a second fastening assembly 44 is located at an inner side 412b of the second lateral plate 412, wherein the leg 441a of the first fastening part 441 is penetrated through a corresponding perforation (not shown) of the circuit board 43. Consequently, the fastening assembly 44 is initially fixed on the circuit board 43. Then, the second fastening part 442 is penetrated through the second lateral plate 412 from an outer side 412b to the inner side 412a and then tightened into the corresponding opening of the second lateral plate 412. The fastening ways of the other fastening assemblies 44 are similar to above fastening way, and are not redundantly described herein. Meanwhile, the first lateral plate 411, the second lateral plate 412 and the circuit board 43 are combined together through the fastening assemblies 44. Then, the first lateral plate 411, the second lateral plate 412 and the circuit board 43 pass through the reflow furnace.

Then, the third fastening part 443 of the first fastening assembly 44 is tightened into the corresponding opening (not shown) of the first lateral plate 411 from the outer side 411b to the inner side 411a of the first lateral plate 411. Similarly, the third fastening part 443 of the second fastening assembly 44 is tightened into the corresponding opening (not shown) of the second lateral plate 412 from the outer side 412b to the inner side 412a of the second lateral plate 412. The fastening ways of the other fastening assemblies 44 are similar to those of the first and second fastening assemblies 44, and are not redundantly described herein. Consequently, the first lateral plate 411, the second lateral plate 412 and the lower plate 413 are combined together, and the circuit board 43 can be supported by the lower plate 413 more securely.

In other words, the first lateral plate 411, the second lateral plate 412, the circuit board 43 and the lower plate 413 can be securely combined together by means of the first fastening parts 441, the second fastening parts 442 and the third fastening parts 443 of the fastening assemblies 44. Moreover, since the heat generation elements 42 are directly fixed on the first lateral plate 411 and the second lateral plate 412, the heat dissipating efficacy is enhanced. Moreover, during the fabricating process, the possibility of cracking of the solder paste or damaging the pins of heat generation element will be minimized. Moreover, the use of the fastening assembly 44 can increase the structural strength of the heat dissipating module. Consequently, the possibility of causing damage of the circuit board 43 will be minimized.

Figure 4:
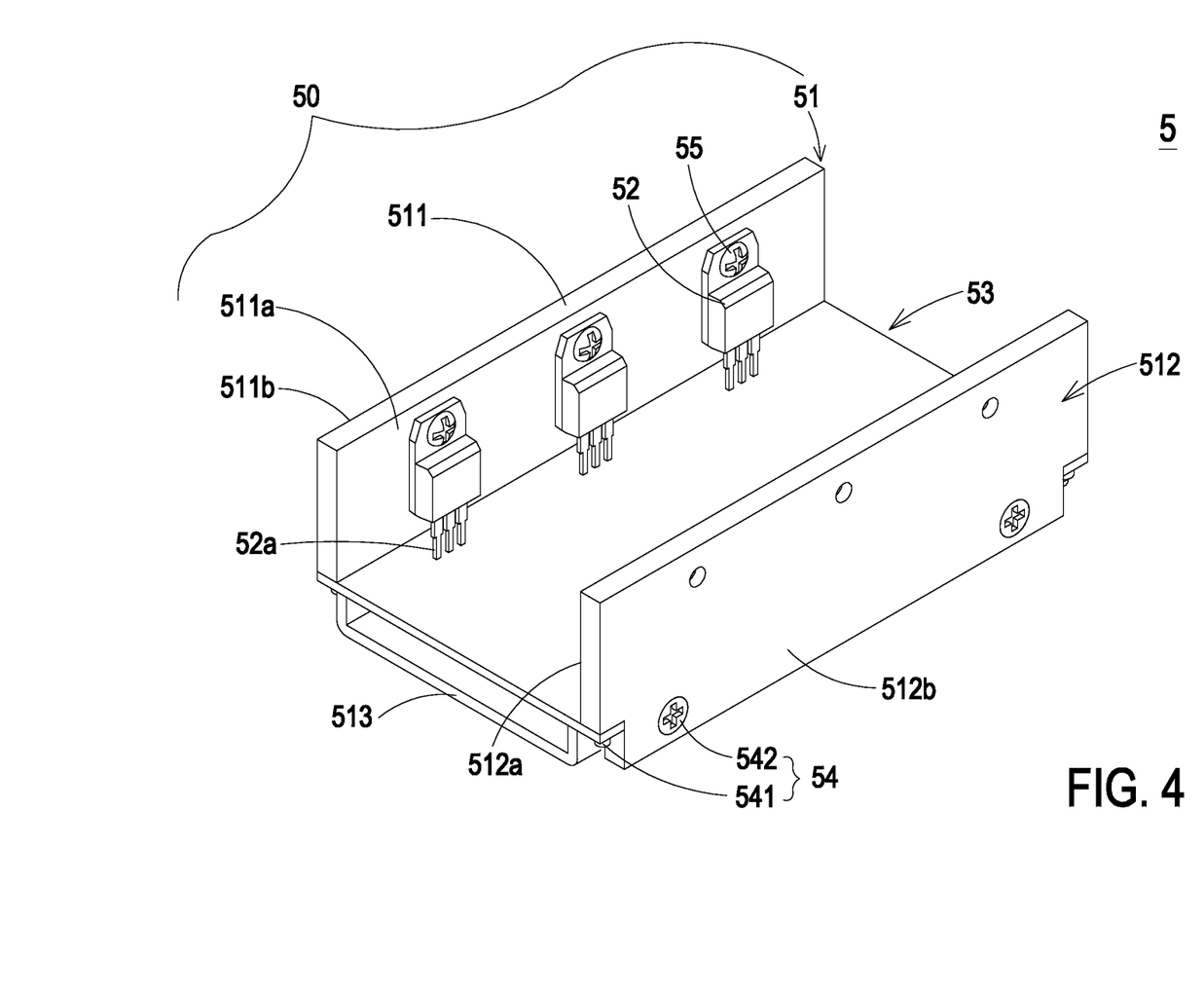
FIG. 4 is a schematic perspective view illustrating a heat dissipating module of an electronic device according to a fourth embodiment of the present invention.

FIG. 4 is a schematic perspective view illustrating a heat dissipating module of an electronic device according to a fourth embodiment of the present invention. As shown in FIG. 4, the heat dissipating module 50 of the electronic device 5 at least comprises a casing 51, a plurality of heat generation elements 52, a circuit board 53, and a plurality of fastening assemblies 54. The casing 51 comprises a first lateral plate 511, a second lateral plate 512, and a lower plate 513. The heat generation element 52 comprises a plurality of pins 52a. Firstly, the heat generation elements 52 are firmly fixed on the first lateral plate 511, the second lateral plate 512 through corresponding fixing elements 55. Then, the pins 52a of the heat generation elements 52 are inserted into corresponding holes (not shown) of the circuit board 53, and the first lateral plate 511, the second lateral plate 512 and the circuit board 53 are combined together through the fastening assemblies 54. In comparison with the above embodiments, the structure of the fastening assembly 54 and the fastening way of the fastening assembly 54 of this embodiment are distinguished. In this embodiment, the fastening assembly 54 comprises a first fastening part 541 and a second fastening part 542. The first fastening part 541 is a protrusion, which is integrally formed with and extended downwardly from an end of the first lateral plate 511 (or the second lateral plate 512). The second fastening part 542 is a screw. In this embodiment, the first fastening parts 541 of two fastening assemblies 54 are extended downwardly from and integrally formed with the first lateral plate 511, and the first fastening parts 541 of other two fastening assemblies 54 are extended downwardly from and integrally formed with the second lateral plate 512.

After the heat generation elements 52 are fixed on the first lateral plate 511 and the second lateral plate 512, the process of assembling the first lateral plate 511, the second lateral plate 512 and the circuit board 53 through the fastening assemblies 54 will be illustrated as follows. Firstly, the first fastening parts 541 of the four fastening assemblies 54 are penetrated through four holes (not shown) of the circuit board 53. Preferably, the holes are located at four corners of the circuit board 53, respectively. Consequently, the first lateral plate 511 and the second lateral plate 512 are supported by the circuit board 53. In addition, the stress generated in the process of assembling the first lateral plate 511, the second lateral plate 512 and the circuit board 53 is uniformly distributed. Then, the second fastening parts 542 of the fastening assemblies 54 are penetrated through the corresponding openings of the first lateral plate 511 and the second lateral plate 512 from the outer sides 511b, 512b to the inner sides 511a, 512a of the lateral plates 511 and 512, and tightened into the lower plate 513. Consequently, the first lateral plate 511, the second lateral plate 512, the circuit board 53 and the lower plate 513 can be securely combined together by means of the first fastening parts 511 and the second fastening parts 512 of the fastening assemblies 54.

From the above discussions, the fastening assembly of the heat dissipating module of the present invention has various aspects. That is, the fastening assembly is not restricted as long as the lateral plate and the circuit board and/or the lower plate are combined together through the fastening assembly. That is, the type and number of the fastening assembly may be varied according to the practical requirements. Moreover, after the lateral plate and the circuit board are combined together through the fastening assembly, the stress is centralized to the fastening assembly. Consequently, the possibility of cracking of the solder paste or damaging the pins of heat generation element will be minimized. Moreover, since the stress during the assembling process is reduced, the possibility of damaging the circuitry of the circuit board is minimized. That is, the use of the fastening assembly can not only simplify the process of assembling the casing with the circuit board but also increase the structural strength of the heat dissipating module.

From the above descriptions, the present invention provides a heat dissipating module and a method of assembling the heat dissipating module. The heat dissipating module comprises a casing, at least one heat generation element, a circuit board, and a fastening assembly. The casing comprises at least one lateral plate. Firstly, the at least one heat generation element is firmly fixed on the at least one lateral plate. Then, the at least one lateral plate and the circuit board are combined together through the at least one fastening assembly. Then, the at least one lateral plate and the circuit board pass through a reflow furnace, so that the at least one heat generation element is welded on the circuit board. As previously described in the prior art, the heat generation element is firstly welded on the circuit board, and then the circuit board is combined with the casing. According to the present invention, the heat generation element is firstly fixed on the casing, and thus there is no gap between the heat generation element and the casing. In other words, it is not necessary to interpose a heat dissipating element between the heat generation element and the casing. Consequently, the heat of the heat generation element can be directly and quickly transferred to the large-area casing, and the fabricating cost is reduced. Moreover, the use of the fastening assembly can not only simplify the process of assembling the casing with the circuit board but also increase the structural strength of the heat dissipating module.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of assembling a heat dissipating module of an electronic device, the method comprising steps of:
   (a) providing at least one lateral plate of a casing, at least one heat generation element, a circuit board and a fastening assembly;
   (b) firmly fixing the at least one heat generation element on the at least one lateral plate through a fixing element;
   (c) combining the at least one lateral plate and the circuit board together through the fastening assembly, wherein a plurality of pins of the at least one heat generation element are inserted into corresponding holes of the circuit board, so that the at least one heat generation element is electrically connected with a trace of the circuit board;
   (d) allowing the at least one lateral plate and the circuit board to pass through a reflow furnace, so that the at least one heat generation element is welded on the circuit board; and
   (e) fixing a lower plate on a lower portion of the at least one lateral plate.

2. The method according to claim 1, wherein the fastening assembly comprises a first fastening part, a second fastening part and a third fastening part, wherein in the step (c), the first fastening part is aligned with a lock part of the at least one lateral plate, the second fastening part is penetrated upwardly through the circuit board and the lock part of the at least one lateral plate, and the second fastening part is combined with the first fastening part, so that the at least one lateral plate, the circuit board and the lower plate are combined together, wherein in the step (e), the third fastening part is penetrated upwardly through the lower plate and combined with the second fastening part, so that the at least one lateral plate, the circuit board and the lower plate are combined together by the first fastening part, the second fastening part and the third fastening part of the fastening assembly.

3. The method according to claim 1, wherein the fastening assembly comprises a first fastening part, a second fastening part and a third fastening part, and the first fastening part comprises a leg and an opening, wherein in the step (c), the first fastening part is located at an inner side of the at least one lateral plate and the leg of the first fastening part is penetrated downwardly through the circuit board, the second fastening part is penetrated through the at least one lateral plate and tightened into the opening of the first fastening part, so that the at least one lateral plate and the lower plate are combined together, wherein in the step (e) the third fastening part is penetrated through the at least one lateral plate and tightened into an opening of the lower plate, so that the at least one lateral plate, the circuit board and the lower plate are combined together by the first fastening part, the second fastening part and the third fastening part of the fastening assembly.

4. The method according to claim 1, wherein the fastening assembly comprises a first fastening part and a second fastening part, wherein the first fastening part of the fastening assembly is integrally formed with the at least one lateral plate and protruded downwardly from an end of the at least one lateral plate, wherein in the step (c), the first fastening part is penetrated through a corner of the circuit board, so that the at least one lateral plate is supported by the circuit board, wherein in the step (e), the second fastening part is penetrated through the at least one lateral plate and tightened into an opening of the lower plate, so that the at least one lateral plate, the circuit board and the lower plate are combined together by the first fastening part and the second fastening part of the fastening assembly.

* * * * *